United States Patent
Kojima et al.

(10) Patent No.: US 8,975,192 B2
(45) Date of Patent: Mar. 10, 2015

(54) METHOD FOR MANUFACTURING SEMICONDUCTOR DEVICE

(75) Inventors: Yasunori Kojima, Hitachi (JP);
Toshiaki Itabashi, Tokyo (JP)

(73) Assignee: Hitachi Chemical Dupont Microsystems Ltd., Tokyo (JP)

( * ) Notice: Subject to any disclaimer, the term of this patent is extended or adjusted under 35 U.S.C. 154(b) by 836 days.

(21) Appl. No.: 12/064,511

(22) PCT Filed: Aug. 22, 2006

(86) PCT No.: PCT/JP2006/316345
§ 371 (c)(1),
(2), (4) Date: Feb. 22, 2008

(87) PCT Pub. No.: WO2007/023773
PCT Pub. Date: Mar. 1, 2007

(65) Prior Publication Data
US 2009/0137129 A1 May 28, 2009

(30) Foreign Application Priority Data
Aug. 22, 2005 (JP) ................. 2005-239610

(51) Int. Cl.
*C03C 15/00* (2006.01)
*C03C 25/68* (2006.01)
(Continued)

(52) U.S. Cl.
CPC ... *H01L 23/3171* (2013.01); *H01L 2224/32225* (2013.01); *H01L 2924/15311* (2013.01);
(Continued)

(58) Field of Classification Search
None
See application file for complete search history.

(56) References Cited

U.S. PATENT DOCUMENTS 4,971,667 A * 11/1990 Yamazaki et al. ....... 204/192.32
6,605,175 B1 * 8/2003 Ramm et al. ............... 156/272.6
(Continued)

FOREIGN PATENT DOCUMENTS

JP 55-104007 A 8/1980
JP 59-158531 A 9/1984
(Continued)

OTHER PUBLICATIONS

Lou et al, Improvement of Epoxy Adhesion to Polyimide Passivation, 2002, Electronci Componenets and Tecnology Conference, pp. 1390-1395.*

(Continued)

*Primary Examiner* — Nadine G. Norton
*Assistant Examiner* — Stephanie Duclair
(74) *Attorney, Agent, or Firm* — Griffin & Szipl, P.C.

(57) ABSTRACT

A method is provided for manufacturing a semiconductor device having a heat-resistant resin film with flip-chip connection structure using a solder bump or a gold bump and an epoxy resin compound laminated thereon, in which adhesiveness is improved particularly after exposure to high temperature and high humidity environments for a long period of time, thereby enhancing the reliability of the semiconductor device. The method, in accordance with the present invention, for manufacturing a semiconductor device having a heat-resistant resin film formed on a semiconductor element and an epoxy resin compound layer laminated thereon, comprises the steps of carrying out a plasma treatment on a surface of the heat-resistant resin film on which the epoxy resin compound layer is laminated using a nitrogen atom-containing gas containing at least one of nitrogen, ammonia, and hydrazine.

5 Claims, 1 Drawing Sheet

(51) Int. Cl.
- *C23F 1/00* (2006.01)
- *B44C 1/22* (2006.01)
- *H01L 21/302* (2006.01)
- *H01L 21/461* (2006.01)
- *H01L 21/56* (2006.01)
- *H01L 23/31* (2006.01)

(52) U.S. Cl.
CPC ..... *H01L21/563* (2013.01); *H01L 2924/01078* (2013.01); *H01L 2924/0102* (2013.01); *H01L 2224/73204* (2013.01); *H01L 2924/01079* (2013.01); *H01L 2224/16225* (2013.01); *H01L 2924/01004* (2013.01); *H01L 2224/73203* (2013.01); *H01L 23/3128* (2013.01)
USPC ........... 438/725; 438/689; 438/706; 438/709; 438/726; 438/737; 216/48; 216/58; 216/63; 216/67

(56) References Cited

U.S. PATENT DOCUMENTS

| | | | |
|---|---|---|---|
| 2002/0137360 A1 | 9/2002 | Tsai et al. | |
| 2003/0049937 A1 | 3/2003 | Suzuki et al. | |
| 2004/0001957 A1* | 1/2004 | Seita et al. | 428/457 |
| 2004/0253388 A1 | 12/2004 | Kim | |
| 2006/0128165 A1* | 6/2006 | Theiss et al. | 438/795 |

FOREIGN PATENT DOCUMENTS

| | | | | |
|---|---|---|---|---|
| JP | 60-262430 A | | 12/1985 | |
| JP | 03-028365 A | | 2/1991 | |
| JP | 3-225993 A | | 10/1991 | |
| JP | 7-94540 A | | 4/1995 | |
| JP | 11-191576 A | | 7/1999 | |
| JP | 2001044233 A | | 2/2001 | |
| JP | 2002-537641 A | | 11/2002 | |
| JP | 2003-073862 A | | 3/2003 | |
| JP | 2003-163451 A | | 6/2003 | |
| JP | 2003163451 | * | 6/2003 | ............... H05K 3/38 |
| JP | 2005-183599 | | 7/2005 | |
| JP | 2006-005302 A | | 1/2006 | |
| JP | 2006-156869 A | | 6/2006 | |
| TW | 462904 B | | 11/2001 | |
| WO | 2007-023781 A1 | | 3/2007 | |

OTHER PUBLICATIONS

Bernier et al, Polymer Surface Modification by Dual Frequency Plasma Treatment, Nov. 9, 1990, American Chemical Society: Metallization of Polymers, pp. 147-160.*

Yuichi Satsu et al., Fundamental Study on the high adhesion technique of the low thermal expansion polymide with metals, Polymer Reprint, 1989, pp. 3708-3710, vol. 38, No. 11, Japan.

Yuichi Satsu et al., Effect of Plasma Treatment on Adhesion of Low Thermal Expansion Polymide Films, The IEICE (Institute of Electronics, Information and Communication Engineers) Transaction, 1991, pp. 489-497, vol. J74-C-II, No. 6, Japan.

Second Chinese Office Action, issued in corresponding Chinese Application No. 200680030441.X, completed Oct. 16, 2009, with partial English translation, 9 pages.

Chinese Office Action No. 200680030441X dated Jan. 9, 2009.

International Search Report (PCT/ISA/210) issued in the corresponding application PCT/JP2006/316345, completed Nov. 13, 2006 and mailed Nov. 21, 2006.

International Search Report (PCT/ISA/210) issued in the corresponding Japanese Application No. PCT/JP2006/316359 completed Sep. 11, 2006 and mailed Sep. 19, 2006.

H.K. Yun et al., "Adhesion Improvement of Epoxy Resin/Polyimide Joints by Amine Treatment of Polyimide Surface," Polymer, vol. 38, No. 4, pp. 827-834, 1997.

Japanese Office Action with partial english translation issued in Japanese Application No. 2005-240204, of co-pending U.S. Appl. No. 12/064,522, dated Nov. 24, 2010.

U.S. Office Action issued in co-pending U.S. Appl. No. 12/064,522, dated Oct. 5, 2010.

Hawley's Condensed Chemical Dictionary 1135 (1981).

Office Action issued on Nov. 1, 2011 in corresponding Japanese Patent Application No. 2005-239610.

Extended European Search Report regarding Application No. 06796608.5 mailed Aug. 16, 2012 and received Aug. 20, 2012.

Glass Transition, Wikipedia, available at http://en.wikipedia.org/wiki/Glass_transition_temperature (downloaded Jul. 23, 2013 12:06PM.

Glass Transition Temperature, McGraw-Hill Dictionary of Scientific and Technical Terms 907 (6th ed. 2003).

* cited by examiner

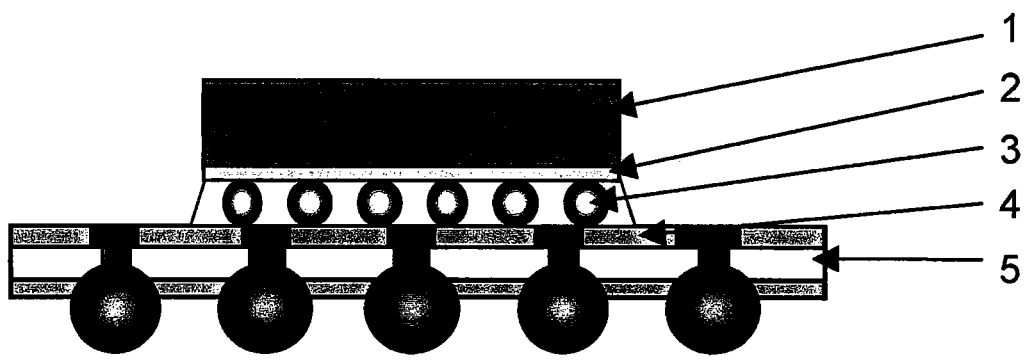

METHOD FOR MANUFACTURING SEMICONDUCTOR DEVICE

This is a National Phase Application in the United States of International Patent Application No. PCT/JP2006/316345 filed Aug. 22, 2006, which claims priority on Japanese Patent Application No. 2005-239610, filed Aug. 22, 2005. The entire disclosures of the above patent applications are hereby incorporated by reference.

FIELD OF THE INVENTION

The present invention relates to a method for manufacturing a semiconductor device having a heat-resistant resin film formed on a semiconductor element and an epoxy resin compound layer laminated thereon. Specifically, the present invention relates to a method for manufacturing a semiconductor device with flip-chip connection structure using a solder bump or a gold bump, in which plasma is used to modify the surface of a heat-resistant resin film which is used suitably for a surface protective film or a stress relaxation layer of a semiconductor element. The present invention is to improve the adhesiveness between the heat-resistant resin film and an epoxy resin compound layer laminated thereon, in particular, the adhesiveness after exposure to high temperature and high humidity environments, thereby enhancing the reliability of the semiconductor device.

BACKGROUND ART

When excellent electrical property and mechanical property are required as a surface protective film of a semiconductor element, an interlayer insulation film or a stress relaxation layer of multilayer connection in a package, heat-resistant resin films such as a polyimide film, a polyamide film, a polyamideimide film, and a polybenzoxazole film are generally used. In recent years, due to the shift to high integration of semiconductor devices, downsizing of packages, and the surface mounting by means of solder reflow or bump techniques, demands for the adhesiveness between the heat-resistant resin film and a package material, such as an underfill material, a film material, an adhesive, and a sealant, have been more and more sophisticated. In particular, the adhesiveness between a heat-resistant resin film and an epoxy resin compound has been required to the same level as the initial value of the semiconductor device even after exposure to a heat cycle or high temperature and high humidity environments. Since the insufficient adhesiveness lowers product life cycle or yield in production, a plasma treatment of the surface film has been widely conducted using an oxygen gas, a fluorohydrocarbon gas, a mixed gas thereof, or an inert gas such as argon.

Patent Reference 1 discloses a technique for enhancing the adhesiveness between a polyimide film and an anisotropically-conductive film by means of oxygen plasma treatment to the polyimide film. It is disclosed that the oxygen plasma can remove organic contaminations on the surface of the polyimide film, and enhance the bond strength by forming functional groups thereon, but the adhesiveness after exposure to a heat cycle or high temperature and high humidity environments is not discussed. Further, Patent Reference 2 discloses a flexible printed wiring substrate obtained by laminating a copper foil via an adhesive composition on a polyimide film which was plasma-treated at low temperature so as to integrate them. It is disclosed that as a gas type for plasma treatment at low temperature, any of an inert gas, oxygen gas, or carbon monoxide gas can be used, so that the adhesiveness relative to the copper foil can be enhanced. However, similarly to Patent Reference 1, the adhesiveness after exposure to a heat cycle or high temperature and high humidity environments is not discussed, either.

Further, Non-Patent Reference 1 discloses the adhesiveness between a polyimide film plasma-treated with various gases and a metallic film. Unlike the above-mentioned Patent Reference 2, effects are exhibited only when a nitrogen gas is used for copper film, while the adhesiveness under high temperature and high humidity is not conducted. On the other hand, Non-Patent Reference 2 discloses influence of a plasma treatment using various gases on the adhesiveness between polyimide films. Unlike Patent References 1 and 2, however, it is disclosed that oxygen plasma treatment dose not improve both the bond strength at the initial value and the adhesiveness after an acceleration test (PCT: pressure cooker test) under high temperature and high humidity. Further, while the bond strength at the initial value is significantly improved in nitrogen plasma treatment, the bond strength is abruptly lowered after exposure to high temperature and high humidity environments for more than 100 hours. The bond strength both at the initial value and after exposure to the environments for a long period of time is greatly improved only in a plasma treatment using a mixed gas of oxygen+carbon tetrafluoride.

Thus, in the conventional arts for improving the adhesiveness of heat-resistant resin films using a plasma treatment, the effect of plasma treatment is greatly differed depending both on materials to be laminated thereon and on gas types to be used for the plasma treatment. This has not yet given clear guideline for the sophisticated demands for the adhesiveness of heat-resistant resin films required for the recent semiconductor devices. In addition, it is empirically known that, depending on the gas types for the plasma treatment, a deteriorated layer such as a carbonized layer may be formed on the surface of the heat-resistant resin films, resulting in the deterioration of the wet property on the surface of the heat-resistant resin films and lowered operability in production and increased deficiency for products in the next step. Furthermore, the adhesiveness between the heat-resistant resin films and adhesive materials laminated thereon after exposure to high temperature and high humidity environments is not discussed at all. Accordingly, the plasma treatment used in the conventional arts cannot be directly applied to current semiconductor devices with a bump structure mounted.

Patent Reference 1: Japanese Unexamined Patent Publication No. 2003-73862
Patent Reference 2: Japanese Unexamined Patent Publication No. 2003-163451
Non-Patent Reference 1: Polymer Preprint, Japan Vol. 38, No. 11, pp 3708-3710 (1989)
Non-Patent Reference 2: The IEICE (Institute of Electronics, Information and Communication Engineers) Transaction, C-II, Vol. J74-C-II, No. 6, pp 489-497 (1991)

DISCLOSURE OF THE INVENTION

Problems to be Solved by the Invention

An object of the present invention is, in light of the above-mentioned problems involved with the conventional arts, to provide a method for manufacturing a semiconductor device having a heat-resistant resin film frequently used for flip-chip connection using a solder bump or a gold bump and an epoxy resin compound laminated thereon, in which the adhesiveness is improved particularly after exposure to high temperature and high humidity environments for a long period of time, thereby enhancing the reliability of the semiconductor device, in particular, a method for treating and modifying the surface.

Means to Solve the Problems

As a result of intensive studies to achieve the above-mentioned object, the inventors have found that (1) the surface modifying techniques of the conventional plasma treatments, which intend to prevent the deteriorated moisture absorption by modifying the surface of a heat-resistant resin film to be hydrophobic as well as to improve the adhesiveness by physically roughing the surface, has a limit to the adhesiveness of a heat-resistant resin film after exposure to high temperature and high humidity environments; that (2) carrying out, instead, an additional plasma treatment using a nitrogen atom-containing gas in an apparatus for manufacturing a semiconductor device, prior to a step of laminating an epoxy resin compound can introduce a chemically stable substituent into the heat-resistant resin film regardless of a plasma treatment in the prior step; and that (3) the chemically stable substituent can exert quite large effect on the improvement of the adhesiveness of the heat-resistant resin film after exposure to high temperature and high humidity environments, improving the wet property of the surface of the heat-resistant resin film, and have completed the present invention.

That is, the present invention is directed to a method for manufacturing a semiconductor device having a heat-resistant resin film formed on a semiconductor element and an epoxy resin compound layer laminated thereon, in which a plasma treatment is carried out on the surface of the heat-resistant resin film on which the epoxy resin compound layer is laminated using a nitrogen atom-containing gas containing at least one of nitrogen, ammonia, and hydrazine.

In the present invention, a plasma treatment can be carried out in a mixed gas including the above-mentioned nitrogen atom-containing gas and hydrogen gas or an inert gas, the percentage of the nitrogen atom-containing gas being 20 to 100% by volume. Further, the heat-resistant resin film formed on the semiconductor device is preferably a film including at least one of the compounds selected from polyimide, polyamide, polyamideimide, polybenzoxazole, polybenzoimidazole, benzocyclobutene, or a copolymer thereof. Moreover, the plasma treatment is preferably carried out in a dry-etching apparatus used for the processing of the semiconductor, with the internal pressure of the dry-etching apparatus being preferably kept within the range of 0.5 Pa to atmospheric pressure. Furthermore, in the present invention, the epoxy resin compound layer laminated on the heat-resistant resin film is preferably an underfill material, a film material, an adhesive, or a sealant.

In accordance with a first embodiment of the present invention, a method for manufacturing a semiconductor device having a heat-resistant resin film formed on a semiconductor element and an epoxy resin compound layer laminated thereon is provided, wherein the method includes the step(s) of carrying out a plasma treatment on a surface of the heat-resistant resin film on which the epoxy resin compound layer is laminated using a nitrogen atom-containing gas containing at least one of nitrogen, ammonia, and hydrazine. In accordance with a second embodiment of the present invention, the first embodiment is modified so that the plasma treatment is carried out in a mixed gas including the nitrogen atom-containing gas containing at least one of nitrogen, ammonia and hydrazine, and hydrogen or an inert gas. In accordance with a third embodiment of the present invention, the first embodiment and the second embodiment are further modified so that the plasma treatment is carried out in a gas of 20 to 100% by volume of the nitrogen atom-containing gas containing at least one of nitrogen, ammonia and hydrazine.

In accordance with a fourth embodiment of the present invention, the first embodiment, the second embodiment and the third embodiment are further modified so that the heat-resistant resin film formed on the semiconductor element is a film including at least one of the compounds selected from polyimide, polyamide, polyamideimide, polybenzoxazole, polybenzoimidazole, benzocyclobutene, or a copolymer thereof. In accordance with a fifth embodiment of the present invention, the first embodiment, the second embodiment, the third embodiment, and the fourth embodiment are further modified so that the plasma treatment is carried out in a dry-etching apparatus used for the processing of the semiconductor. In accordance with a sixth embodiment of the present invention, the fifth embodiment is further modified so that an internal pressure of the dry-etching apparatus is kept within the range of 0.5 Pa to atmospheric pressure. In accordance with a seventh embodiment of the present invention, the first embodiment, the second embodiment, the third embodiment, the fourth embodiment, the fifth embodiment, and the sixth embodiment are further modified so that the epoxy resin compound layer laminated on the heat-resistant resin film is an underfill material, a film material, an adhesive, or a sealant.

Effect of the Invention

According to the method for manufacturing the semiconductor device (surface modification treatment method) of the present invention, when a package material, such as an underfill material, a film material, an adhesive, and a sealant consisting of an epoxy resin compound, is laminated on a heat-resistant resin film used as a surface protective film of a semiconductor element, an interlayer insulation film or a stress relaxation layer of multilayer connection in a package, the laminated and joined portions have good bond strength at the initial value as well as good adhesiveness even after exposure to high temperature and high humidity environments, to obtain a semiconductor device with high reliability over a long period of time. Further, since the wet property of the surface of the heat-resistant resin film can also be improved, an epoxy resin compound can be well coated or laminated on a substrate of the semiconductor device on which the heat-resistant resin film is formed, thereby to decrease deficiency of products.

BRIEF DESCRIPTION OF THE DRAWINGS

FIG. 1 is a view showing one example of the structure of a semiconductor device in the present invention.

BEST MODE FOR CARRYING OUT THE INVENTION

A semiconductor device of the present invention is explained with reference to a drawing (FIG. 1), in which an epoxy resin underfill material is applied to a heat-resistant resin film. A semiconductor device 1 is formed generally on a substrate or a wafer, such as a silicon, by a publicly-known method, and on the surface thereof, a heat-resistant resin film 2 such as polyimide is formed in a single layer or in a multi-layer for the purpose of surface protection, stress relaxation, or insulation of multilayer connection. This heat-resistant resin film 2 has an electrode for supplying a signal or electrical power, on which a solder bump 3 is formed for the connection with a mounted substrate 5. The production steps up to this point are usually carried out in the state of wafer, which is then separated into pieces of dies when mounting, and they are joined to the mounted substrate 5 by reflow furnace after positioning. Thereafter, an underfill material 4 is filled to improve reliability and drop resistance of the semiconductor device, and then cure treatment is carried out to firmly join it with the mounted substrate. The plasma surface modification treatment using a nitrogen atom-containing gas of the present invention is, for example, carried out in the state of wafer after the formation of the bump in the above-mentioned production step.

The heat-resistant resin used in the present invention is, for example, a polyimide compound having a repeating unit represented by the general formula (I):

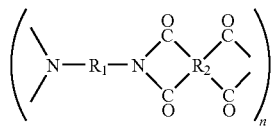

wherein
$R_1$ and $R_2$ represent an aromatic cyclic group, an aliphatic cyclic group or a chained group containing the same, and examples of which include polyimide, polyamide, polyamideimide, polybenzoxazole, polybenzoimidazole, benzocyclobutene, and a copolymer thereof. Further, a precursor of at least one polymer selected from polyamide, polyimide, polyamideimide, polybenzoxazole, polybenzoimidazole, and benzocyclobutene can also be used. In this case, photosensitively pretreated polyimide or polybenzoxazole can also be used. Examples of commercially available heat-resistant resin compounds include HD 4000 series, HD 8800 series and PIQ series, all of which are manufactured by Hitachi Chemical DuPont MicroSystems, Ltd.

When the heat-resistant resin of the present invention is a photosensitive resin, the resin composition is spin-coated on a silicon substrate, for example, by rotational coating, and a solvent is evaporated on a hot plate to obtain a prebaked film. For example, a predetermined mask pattern is printed on the obtained prebake film with an exposure apparatus with an ultra high pressure mercury lamp as a light source, in order to open a polar zone, and thereafter a puddle or spray development is carried out using a developer to obtain a relief pattern. The obtained patterned substrate is heat-treated in an oven or cure furnace under a nitrogen atmosphere, so that a cyclization reaction is carried out to obtain a heat-resistant rein film. Then, a metallic film to be UBM (under bump metal) or a rewiring layer is formed on the obtained heat-resistant resin film by means of sputtering method or plating method. In the case of a multilayer semiconductor device, a rewiring layer is formed, and subsequently the above-mentioned heat-resistant resin film is repeatedly coated to form a polar zone. A bump is thus formed on the surface of the heat-resistant resin film using solder or gold, and a plasma treatment described later is carried out, then the bump is mounted on a substrate by flip-chip method. For a solder bump, it is common to connect it to the mounted substrate, and subsequently fill an underfill material into the gap, to be cured. For stud bump or Ni—Au bump, after the formation of a bump, a plasma treatment is carried out, and subsequently it is thermocompressed on the mounted substrate via an adhesive film or a paste.

In the present invention, when a package material, such as an underfill material, a film material, an adhesive, and a sealant consisting of an epoxy resin compound, is laminated on the heat-resistant resin film, a compound having two or more oxirane rings in one molecule (an epoxy resin compound) can be used without particular limitation. Examples of commercially available epoxy resin compounds include U-8400 series manufactured by Namics corporation and CEL-C-3700 series manufactured by Hitachi Chemical, Co. Ltd.

The package material may be in a form of a liquid or a paste. It may also be used in a form of a solid such as a film or a powder, which can be laminated by publicly-known methods such as coating, patching and sealing.

The epoxy resin compound is firmly joined to the heat-resistant resin film (i) by filling it into the gap between the mounted substrate and the flip chip and subsequently subjected to heat curing treatment for an underfill material, or (ii) by pressure-bonding to the heat-resistant resin film and subsequently subjected to heat curing treatment for a film material. In particular, in the case of the underfill material, if the wet property of the surface of the heat-resistant resin film to be joined is bad, the time required to fill the material will be longer, and lower the operability in production, which may lead to the fear of lowered yield and lowered reliability due to the occurrence of voids. In addition, if the adhesiveness between the semiconductor device and the mounted substrate is bad, poor conduction in gold bump products or poor drop impact resistance may be also occurred in solder bump products. Therefore, both the wet property of the surface of the heat-resistant resin film and the adhesiveness between the heat-resistant resin film and the epoxy resin compound are very important properties.

As an apparatus to be used for a plasma treatment, a common plasma device provided with gas supply and gas discharge portions used for the reaction can be used. A dry-etching apparatus used for the processing of a semiconductor is preferably used. The use of the dry-etching apparatus for the semiconductor processing makes possible consistent treatment with the substrate as it is in the semiconductor device production line without separating the semiconductor device into each piece. A substrate on which the heat-resistant resin film is formed is placed at the inside of a plasma treatment reaction chamber, an electric field is applied from the inside or the outside of the reaction chamber, and a supplied gas is activated at low temperature, to carry out surface treatment.

The gas used for the plasma treatment includes at least one nitrogen atom-containing gas type selected from the group consisting of nitrogen, ammonia, and hydrazine, and nitrogen or ammonia is more preferable. In addition, the nitrogen atom-containing gas type can comprise an inert gas such as helium or argon, or hydrogen, but the percentage of the nitrogen atom-containing gas type in the gas used in a plasma treatment of the present invention is preferably 20 to 100% by volume. Further, the nitrogen atom-containing gas type preferably does not contain oxygen or fluorohydrocarbon, or, when containing, the percentage of oxygen or fluorohydrocarbon is set to be 50% or less.

When a plasma treatment is carried out using the nitrogen atom-containing gas, functional group such as amide(—NH—) or amine(—NH$_2$) is formed on the surface of the heat-resistant resin film (Non-Patent Reference 1). The functional group, in the case of laminating heat-resistant resin films on top of the other, cannot accomplish the improvement of adhesiveness after exposure to high temperature and high humidity environments (Non-Patent Reference 1). However, in the case of laminating an epoxy resin compound on the heat-resistant resin film, they remarkably improve the adhesiveness after exposure thereto. It is considered that this is because the functional group such as amide(—NH—) or amine(—$NH_2$) formed on the surface of the heat-resistant resin film by the plasma treatment forms firm chemical bond with the repeating structure of oxirane rings of the epoxy resin compound. It is considered that this is the reason why, in the case of laminating the epoxy resin compound on the heat-resistant resin film, the improved adhesiveness after exposure to high temperature and high humidity environments, which can not be obtained by hydrogen bond, can be secured in addition to excellent bond strength at the initial value.

In the plasma treatment, subsequent to introduction of the above-mentioned nitrogen atom-containing gas, or a mixed gas of the nitrogen atom-containing gas and an inert gas or a hydrogen gas, high frequency plasma treatment is applied with the pressure maintained constant to generate plasma discharge for a set period of time. The process pressure in the system is within the range of 0.5 Pa to atmospheric pressure, preferably 50 to 700 Pa. Applicable pressure varies depending on the forms of plasma generation apparatuses, power supply frequencies, or the types of gases. When the pressure in the system is kept within the above-mentioned range, plasma discharge can be maintained, allowing surface modification treatment to be well performed. The time required for the treatment is 0.1 to 60 minutes, and, in the case of sheet-fed type apparatus for treating one by one, preferably 0.5 to 5 minutes. For other conditions such as electrical power applied, bias voltage, and substrate temperature, publicly-known methods can be used, but in order to maintain good surface, preferably substrate bias or auto-bias voltage is set to −200 V or less, and the substrate temperature is set to 200° C. or less.

Further, the present invention is directed to forming on the surface of the heat-resistant resin film functional group which contributes the improvement of adhesiveness, by carrying out a plasma treatment using a nitrogen atom-containing gas. At this time, for the purpose of removing contaminations and deteriorated layers on the heat-resistant resin film and the improvement of surface roughness, a plasma treatment is first carried out using, for example, oxygen or a mixed gas of oxygen/carbon tetrafluoride, and then, for the purpose of introducing functional group effective for the improvement of adhesiveness, a plasma treatment can be carried out continuously or discontinuously using the nitrogen atom-containing gas of the present invention. It is very important at this time is that the final plasma treatment should be carried out using the nitrogen atom-containing gas.

A semiconductor element subjected to surface modification treatment of the heat-resistant resin film in accordance with the present invention is kept in a clean and low humidity environment to maintain a good surface. In the next step, a package material, such as an underfill material, a film material, an adhesive, and a sealant consisting of a compound having the repeating structure of oxirane rings used in the present invention (an epoxy resin compound), is laminated thereon preferably within 6 months. While, even if the left-to-stand-time to the next step was longer, although the package material can be laminated as it is, preferably, the nitrogen atom-containing plasma treatment can be repeated again in advance, or a heat treatment to discharge adsorbed moisture can also be carried out. However, if the plasma treatment is carried out without using the nitrogen atom-containing gas, the functional group formed on the surface of the heat-resistant resin film in accordance with the present invention is disappeared.

The package material may be used in a form of a liquid or a paste. It may be also used in a form of a solid such as a film or a powder, which can be laminate-treated by publicly-known methods such as coating, patching and sealing.

In the method for manufacturing a semiconductor device of the present invention, general production methods for semiconductor devices can be used for steps other than the step of laminate-treating the package material on the surface subjected to plasma surface modification treatment.

EXAMPLES

Hereinbelow, the present invention will be described with reference to Examples, and explanations in such Examples illustrate the present invention, but do not limit the scope of the present invention. Further, in the following examples, an example will be shown, in which after cure treatment of a polyimide precursor resin, surface modification treatment is carried out by means of a high frequency plasma treatment in the presence of a nitrogen atom-containing gas, and then an epoxy resin underfill material is laminated thereon.

Example 1

About 3 g of self-priming polyimide precursor resin varnish (HD 4000, manufactured by Hitachi Chemical DuPont MicroSystems, Ltd.) was added dropwise to 5-inch silicon substrate, and was spin-coated for 30 seconds at 3800 rpm. The silicon substrate on which the polyimide precursor resin varnish was coated was heated and baked on hotplates maintained respectively at 80° C. and 90° C. for 100 seconds to evaporate a solvent, so that a polyimide precursor coating having a film thickness of 10 μm was formed. The substrate was heated in a furnace under a nitrogen gas at 375° C. for 60 minutes to perform dehydration condensation reaction, so that a polyimide resin film-attached substrate having a film thickness of about 5 μm was obtained. In the surface modification treatment, the obtained polyimide resin film-attached substrate was first degassed to remove residues in the actual steps, using a plasma etching apparatus (CSE-1110) manufactured by Nippon Shinku Co., Ltd.), and subsequently plasma-treated for 2 minutes at internal pressure of 10 Pa and high frequency power of 100 W while flowing a mixed gas of oxygen/tetrafluoromethane at the ratio of 85%/15% by volume at a flow rate of 25 cc/min. After plasma treatment, the mixed gas was discharged to be returned to the atmospheric pressure. Then, degassing was carried out using the same apparatus, and subsequently a plasma treatment was carried out for 2 minutes at internal pressure of 10 Pa and high frequency power of 100 W while flowing a nitrogen gas at the percentage of 100% by volume of nitrogen at a flow rate of 25 cc/min. A plurality of the polyimide resin film-attached substrate were provided, and a half of them were used for the measurement of the wet property of the surface of the polyimide film after subjected to the plasma treatment.

For the evaluation of the wet property, a contact angle was determined using CA-D contact angle meter manufactured by Kyowa Interface Science Co., Ltd., by adding pure water dropwise to the polyimide resin film-attached substrate using a syringe. In order to measure the bond strength relative to an underfill material, it was cut into 1-cm square by a dicer with a diamond cutter, and the same 1-cm square mold was placed on the substrate, into which a thermoset epoxy underfill material (8439-1, manufactured by Namics corporation) was filled, to perform prebaking on a hotplate at 80° C., with subsequent cure treatment being carried out in an oven at 150° C. for 60 minutes, followed by removing the mold to obtain a sample piece. A plurality of the sample pieces were provided, and a half of them were loaded into a heating/humidifying tester at 131° C. and 85 RH % for 168 hours, to perform comparative evaluation of the bond strength and the failure mode with untreated samples using a bond strength tester. Series 4000 bond strength tester manufactured by Dage, Ltd. was used for the measurement of the bond strength (shear fracture strength) at room temperature. The failure mode was observed by visual inspection using a magnifying glass. The results are shown in Table 1.

Example 2

The polyimide resin film-attached substrate finished with a plasma treatment produced in the same manner as Example 1 was left to stand in the atmosphere at room temperature for 6 months. Sample pieces were produced in the same manner as Example 1 to measure the bond strength and to observe the failure mode. The results are shown in Table 1.

Example 3

A plasma treatment was carried out in the same manner as Example 1, except for using a gas at the percentage of 100% by volume of a forming gas which is a mixed gas of nitrogen and 3 to 10% by volume of hydrogen, in place of a nitrogen gas. Sample pieces were produced to measure the bond strength and to evaluate the failure mode and the wet property. The results are shown in Table 1.

Comparative Example 1

A plasma treatment was not carried out either for treating residues or in a nitrogen atom-containing gas on the polyimide resin film-attached substrate having a film thickness of about 5 μm produced in the same manner as Example 1. Sample pieces were produced in the same manner as Example 1 to measure the bond strength and to evaluate the failure mode and the wet property. The results are shown in Table 1.

Comparative Example 2

A plasma treatment was carried out for treating residues but not carried out the subsequent treatment with a nitrogen atom-containing gas on the polyimide resin film-attached substrate having a film thickness of about 5 μm produced in the same manner as Example 1. Sample pieces were produced in the same manner as Example 1 to measure the bond strength and to evaluate the failure mode and the wet property. The results are shown in Table 1.

Comparative Example 3

A plasma treatment was carried out in the same manner as Example 1, except for carrying out an oxygen plasma treatment for 5 minutes at internal pressure of 133 Pa and high frequency power of 400 W while flowing 100% by volume of an oxygen gas at a flow rate of 100 cc/min., using an oxygen plasma device (Model NO.: PC101A) manufactured by Yamato Scientific Co., Ltd. after plasma treatment for removing residues on the polyimide resin film-attached substrate having a film thickness of about 5 μm produced in the same manner as Example 1. Sample pieces were produced to measure the bond strength and to evaluate the failure mode and the wet property. The results are shown in Table 1.

Comparative Example 4

A plasma treatment was carried out in the same manner as Example 1, except for using 100% by volume of a tetrafluoromethane gas in place of a nitrogen gas after plasma treatment for removing residues on the polyimide resin film-attached substrate having a film thickness of about 5 μm. Sample pieces were produced to measure the bond strength and to evaluate the failure mode and the wet property. The results are shown in Table 1.

TABLE 1

| | Heat-resistant resin | Residue treatment gas | Surface modification treatment gas | Left to stand after treatment | Laminated resin | Initial value | | 131° C. 85 RH %, after 168 hr. | | Contact angle of water |
|---|---|---|---|---|---|---|---|---|---|---|
| | | | | | | Bond strength | Failure mode | Bond strength | Failure mode | |
| Example 1 | Polyimide | Tetrafluoromethane/Oxygen = 85/15% volume | Nitrogen = 100% by volume | None | Epoxy underfill material | 20.83 kg | Underfill material Cohesive failure | 19.15 kg | Underfill material Cohesive failure | <3 |
| Example 2 | Polyimide | Tetrafluoromethane/Oxygen = 85/15% volume | Nitrogen = 100% by volume | Room temperature 6 months | Epoxy underfill material | 17.78 kg | Underfill material Cohesive failure | — | — | — |
| Example 3 | Polyimide | Tetrafluoromethane/Oxygen = 85/15% volume | Foaming gas = 100% by volume | None | Epoxy underfill material | 23.57 kg | Underfill material Cohesive failure | 20.73 kg | Underfill material Cohesive failure | 45.2 |
| Comparative Example 1 | Polyimide | No treatment | No treatment | None | Epoxy underfill material | 16.58 kg | Underfill material Cohesive failure | 6.42 kg | Polyimide/Underfill Interface failure | 61.7 |
| Comparative Example 2 | Polyimide | Tetrafluoromethane/Oxygen = 85/15% volume | No treatment | None | Epoxy underfill material | 24.07 kg | Underfill material Cohesive failure | 17.29 kg | Polyimide/Underfill Interface failure | 42.5 |

TABLE 1-continued

| | Heat-resistant resin | Residue treatment gas | Surface modification treatment gas | Left to stand after treatment | Laminated resin | Initial value | | 131° C. 85 RH %, after 168 hr. | | Contact angle of water |
|---|---|---|---|---|---|---|---|---|---|---|
| | | | | | | Bond strength | Failure mode | Bond strength | Failure mode | |
| Comparative Example 3 | Polyimide | Tetrafluoromethane/Oxygen = 85/15% volume | Oxygen = 100% by volume | None | Epoxy underfill material | 20.06 kg | Underfill material Cohesive failure or Bonded interface failure | 5.03 kg | Polyimide/Underfill Interface failure | <5 |
| Comparative Example 4 | Polyimide | Tetrafluoromethane/Oxygen = 85/15% volume | Tetrafluoromethane = 100% by volume | None | Epoxy underfill material | 22.69 kg | Underfill material Cohesive failure | 9.86 kg | Polyimide/Underfill Interface failure | 96.5 |

As shown in Table 1, when a plasma treatment was carried out in a nitrogen gas (Example 1), even after humidifying/heating acceleration test at 131° C. and 85 RH %, the decrease in the bond strength was small, and the failure mode was a cohesive failure of the laminated epoxy underfill materials. Further, also in the case of using a forming gas with a mixed gas of nitrogen and hydrogen (Example 3), the failure mode after the humidifying/heating acceleration test was a cohesive failure of epoxy underfill materials. With regard to the wet property of the surface of the polyimide film, plasma treated example with a nitrogen gas (Example 1) shows a wet property equal to or more than plasma-treated example with oxygen (comparative Example 3), which is frequently used generally for a hydrophilic treatment. In particular, when the epoxy resin compound is laminated in a form of a liquid or a paste, a processing time can be shortened, and it can also be expected that the occurrence of voids is controlled so as to remarkably enhance the yield and reliability, together with the enhancement of adhesiveness. Further, also in the case where a plasma treatment was carried out in a nitrogen gas followed by being left to stand for 6 months (Example 2), the decrease in the bond strength at the initial value was small, so that the plasma treatment of the present invention is understood to maintain its effect for a long period of time.

On the other hand, when a plasma treatment was not carried out at all (Comparative Example 1), when only a plasma treatment with a mixed gas of carbon tetrafluoride and oxygen for the purpose of removing residues was carried out (Comparative Example 2), or when a plasma treatment was carried out with oxygen or carbon tetrafluoride even after the removal of residues (Comparative Examples 3 and 4), the bond strength at the initial value was maintained at a high level, however, the bond strength was remarkably lowered after the humidifying/heating acceleration test. Further, regarding the failure mode, an interface failure is occurred between the polyimide film and the underfill material, which verifies lowered bond strength. The oxygen plasma treatment (Comparative Example 3) demonstrated almost equal wet property to that of Example 1, but the bond strength after the humidifying/heating acceleration test was lowered greatly. Further, it was observed in the plasma treatment with tetrafluoromethane (Comparative Example 4) that the contact angle was large, and the wet property was extremely bad compared with Examples 1 and 3. Thus, when a plasma treatment was not carried out with a nitrogen atom-containing gas even after residues removal treatment, the adhesiveness and the wet property after the humidifying/heating acceleration test could not be compatible.

The invention claimed is:

1. A method for manufacturing a semiconductor device with flip-chip connection structure using a solder bump or a gold bump having a heat-resistant resin film formed on a semiconductor element and an epoxy resin compound layer laminated thereon, the method comprising the steps of:
   (a) providing a semiconductor device with flip-chip connection structure using the solder bump or a gold bump and having the heat-resistant resin film formed on the semiconductor element and the epoxy resin compound layer laminated thereon,
   wherein the heat-resistant resin film is a film including at least one of the compounds selected from the group consisting of polyimide, polyamide, polyamideimide, polybenzoxazole, polybenzoimidazole, benzocyclobutene, and a copolymer thereof, and
   wherein the epoxy resin compound layer is an underfill material, a film material, an adhesive, or a sealant;
   (b) carrying out a first plasma treatment on a surface of the heat-resistant resin film using oxygen or a mixed gas of oxygen and tetrafluoromethane;
   (c) carrying out a high frequency plasma treatment on a surface of the heat-resistant resin film on which the epoxy resin compound layer is laminated using a nitrogen gas, wherein the high frequency plasma treatment is a treatment for activating a gas at a bias voltage of a plasma treatment apparatus of −200 V or less and at a low substrate temperature of 200° C. or less in order to control the formation of a deteriorated layer; and
   (d) introducing a functional group of amide or amine to the surface of the heat-resistant film during the high frequency plasma treatment using the nitrogen gas.

2. The method for manufacturing a semiconductor device according to claim 1, wherein the high frequency plasma treatment is carried out in a dry-etching apparatus used for processing of the semiconductor.

3. The method for manufacturing a semiconductor device according to claim 2, wherein an internal pressure of the dry-etching apparatus is kept within the range of 0.5 Pa to atmospheric pressure.

4. The method for manufacturing a semiconductor device according to claim 1, wherein the deteriorated layer is a carbonized layer.

5. The method for manufacturing a semiconductor device according to claim 1, wherein the mixed gas of oxygen and tetrafluoromethane is at the ratio of 85%/15% by volume.

* * * * *